(12) United States Patent
Ko

(10) Patent No.: US 9,318,177 B2
(45) Date of Patent: Apr. 19, 2016

(54) SEMICONDUCTOR DEVICES AND SEMICONDUCTOR SYSTEMS INCLUDING THE SAME

(71) Applicant: SK hynix Inc., Icheon-si, Gyeonggi-do (KR)

(72) Inventor: Bok Rim Ko, Seoul (KR)

(73) Assignee: SK hynix Inc., Icheon-si (KR)

( * ) Notice: Subject to any disclaimer, the term of this patent is extended or adjusted under 35 U.S.C. 154(b) by 231 days.

(21) Appl. No.: 14/107,039

(22) Filed: Dec. 16, 2013

(65) Prior Publication Data

US 2015/0009774 A1  Jan. 8, 2015

(30) Foreign Application Priority Data

Jul. 5, 2013 (KR) .................. 10-2013-0079242

(51) Int. Cl.
*G11C 8/00* (2006.01)
*G11C 8/18* (2006.01)
*G11C 8/06* (2006.01)

(52) U.S. Cl.
CPC ... *G11C 8/18* (2013.01); *G11C 8/06* (2013.01)

(58) Field of Classification Search
USPC .................................... 365/230.08
See application file for complete search history.

(56) References Cited

U.S. PATENT DOCUMENTS

| 7,420,872 B2 * | 9/2008 | Yang | G11C 7/1078 365/230.06 |
| 8,436,651 B2 * | 5/2013 | Yoon | H04L 7/02 326/46 |
| 2010/0327877 A1 * | 12/2010 | Kang | G06K 7/0008 324/537 |

FOREIGN PATENT DOCUMENTS

| KR | 1020060054575 A | 5/2006 |
| KR | 1020070075572 A | 7/2007 |

* cited by examiner

*Primary Examiner* — Hoai V Ho
*Assistant Examiner* — Pablo Huerta
(74) *Attorney, Agent, or Firm* — William Park & Associates Ltd.

(57) ABSTRACT

The semiconductor device includes an internal command generator and an internal address generator. The internal command generator generates first and second command latch signals from first and second internal clock signals in response to an external control signal and latches a command signal in response to the first and second command latch signals to generate a synthesized internal command signal. The internal address generator generates first and second address latch signals from the first and second internal clock signals in response to the external control signal and latches an address signal in response to the first and second address latch signals to generate a synthesized internal address signal.

18 Claims, 4 Drawing Sheets

SEMICONDUCTOR DEVICES AND SEMICONDUCTOR SYSTEMS INCLUDING THE SAME

CROSS-REFERENCE TO RELATED APPLICATION

The present application claims priority under 35 U.S.C 119(a) to Korean Application No. 10-2013-0079242, filed on Jul. 5, 2013, in the Korean Intellectual Property Office, which is incorporated herein by reference in its entirety as set forth in full.

BACKGROUND

1. Technical Field

Embodiments of the present disclosure generally relate to semiconductor integrated circuits and, more particularly, to semiconductor devices and semiconductor systems including the same.

2. Related Art

Mobile systems such as portable computers, personal digital assistants (PDAs) and portable phones have been developed to reduce the weight thereof for portability. Batteries supplying electric power to the mobile systems may largely affect the total weight of the mobile systems. If power consumption of semiconductor devices employed in the mobile systems is lowered, the capacity of the batteries may also be reduced to thus decrease the total weight of the mobile systems. Fast mobile systems are increasingly in demand with the development of multi-functional mobile systems. Accordingly, data transmission speeds of the semiconductor devices such as mobile memory devices (also, referred to as mobile memory chips) may be important factors in the determination of operation speeds of the high performance mobile systems.

Recently, the semiconductor devices have been designed to simultaneously receive command signals and address signals through ten pins. In such a case, the signals inputted through the ten pins include all information on the command signals and the address signals, and a command decoder and an address decoder decode the singles inputted through the ten pins to extract the command signals and the address signals.

In the case of synchronous semiconductor devices, the command signals and the address signals are inputted in synchronization with a clock signal. For example, double data rate (DDR) semiconductor devices receive the command signals and the address signals in synchronization with a rising edge and a falling edge of the clock signal, and single data rate (SDR) semiconductor devices receive the command signals and the address signals in synchronization with a rising edge of the clock signal.

SUMMARY

Various embodiments are directed to semiconductor devices and semiconductor systems including the same.

According to an embodiment, a semiconductor device includes an internal command generator and an internal address generator. The internal command generator generates first and second command latch signals from first and second internal clock signals in response to an external control signal and latches a command signal in response to the first and second command latch signals to generate a synthesized internal command signal. The internal address generator generates first and second address latch signals from the first and second internal clock signals in response to the external control signal and latches an address signal in response to the first and second address latch signals to generate a synthesized internal address signal.

According to an embodiment, a semiconductor system includes a controller and a semiconductor device. The controller generates a clock signal, an external control signal, a command signal and an address signal. The semiconductor device includes an internal command generator, and the internal command generator generates first and second command latch signals from first and second internal clock signals generated from the clock signal in response to the external control signal and latches the command signal in response to the first and second command latch signals to generate a synthesized internal command signal.

According to an embodiment, a semiconductor system includes a controller and a semiconductor device. The controller generates a clock signal, an external control signal, a command signal and an address signal. The semiconductor device includes an internal address generator, and the internal address generator generates first and second address latch signals from first and second internal clock signals generated from the clock signal in response to the external control signal and latches the address signal in response to the first and second address latch signals to generate a synthesized internal address signal.

BRIEF DESCRIPTION OF THE DRAWINGS

Embodiments of the present invention will become more apparent in view of the attached drawings and accompanying detailed description, in which.

DETAILED DESCRIPTION

Various embodiments of the present invention will be described hereinafter with reference to the accompanying drawings. However, the embodiments described herein are for illustrative purposes only and are not intended to limit the scope of the present invention.

Figure 1:
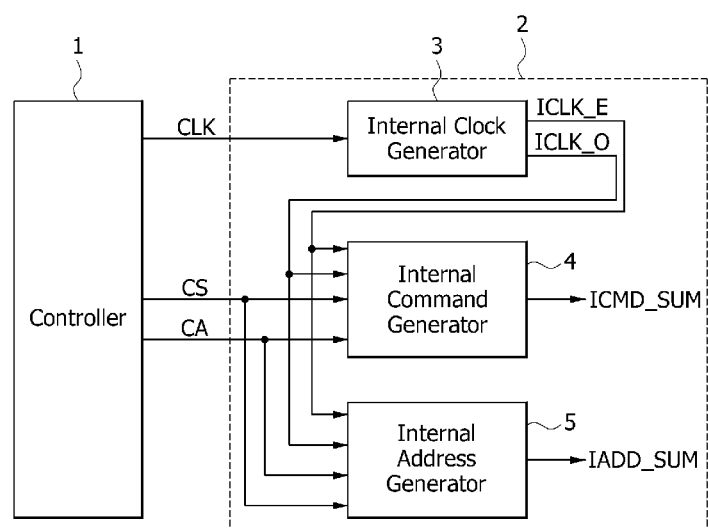
FIG. 1 is a block diagram illustrating a semiconductor system according to an embodiment of the present invention.

Referring to FIG. 1, a semiconductor system according to an embodiment of the present invention may include a controller 1 and a semiconductor device 2. The semiconductor device 2 may include an internal clock generator 3, an internal command generator 4 and an internal address generator 5.

The controller 1 may apply a clock signal CLK, a chip selection signal CS and a command address signal CA to the semiconductor device 2. The chip selection signal CS may correspond to a command signal enabled to select a chip (not shown) including the semiconductor device 2 and may be a control signal supplied from an external device. The command address signal CA may include a command signal and an address signal and may be transmitted to the same pin (not shown). In various embodiments, the command signal and the address signal may be separated from each other, and the command signal and the address signal may be inputted to the semiconductor device 2 through respective ones of separate pins (not shown).

The internal clock generator 3 may divide the clock signal CLK to generate a first internal clock signal ICLK_E and a second internal clock signal ICLK_O. The first and second internal clock signals ICLK_E and ICLK_O may be generated to become 2-division signals of the clock signal CLK. That is, the first and second internal clock signals ICLK_E and ICLK_O may be generated to have a frequency which is half that of the clock signal CLK. The second internal clock signal ICLK_O may be generated to be a complementary signal of the first internal clock signal ICLK_E. Thus, a phase difference between the first and second internal clock signals ICLK_E and ICLK_O may be 180 degrees.

The internal command generator 4 may latch the command address signal CA in response to the chip selection signal CS and the first and second internal clock signals ICLK_E and ICLK_O to generate a synthesized internal command signal ICMD_SUM. The internal address generator 5 may latch the command address signal CA in response to the chip selection signal CS and the first and second internal clock signals ICLK_E and ICLK_O to generate a synthesized internal address signal IADD_SUM.

Figure 2:
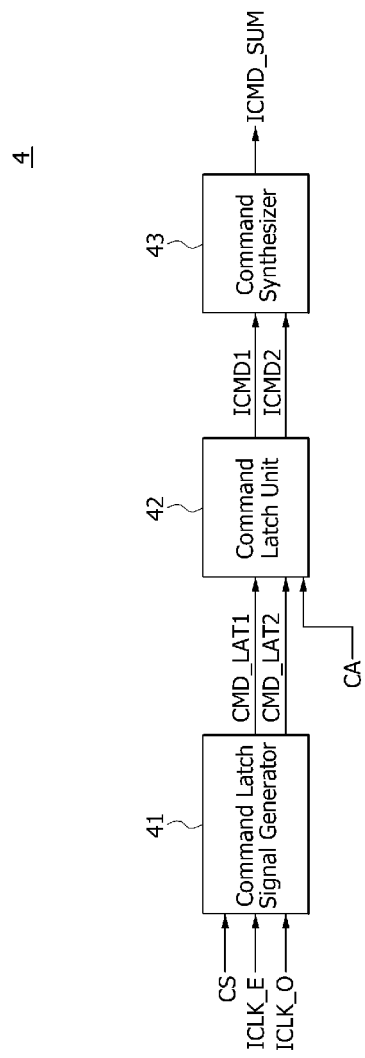
FIG. 2 is a block diagram illustrating an internal command generator included in the semiconductor system of FIG. 1.

Referring to FIG. 2, the internal command generator 4 may include a command latch signal generator 41, a command latch unit 42 and a command synthesizer 43.

The command latch signal generator 41 may generate a pulse of a first command latch signal CMD_LAT1 from the first internal clock signal ICLK_E when a pulse of the chip selection signal CS is inputted thereto. An external control signal may include the chip selection signal CS and may be used for selecting a chip included in the semiconductor device 2 and for selecting the semiconductor device itself. The command latch signal generator 41 may generate a pulse of a second command latch signal CMD_LAT2 from the second internal clock signal ICLK_O when a pulse of the chip selection signal CS is inputted thereto. The pulses of the first and second command latch signals CMD_LAT1 and CMD_LAT2 may be generated at different points of time with different pulse widths according to the embodiments. In the present embodiment, the pulse of the first command latch signal CMD_LAT1 may be generated in synchronization with a rising edge of the first internal clock signal ICLK_E in a period that the pulse of the chip selection signal CS is inputted and may be generated to have a pulse width corresponding to a half of a cycle time of the first internal clock signal ICLK_E. Furthermore, the pulse of the second command latch signal CMD_LAT2 may be generated in synchronization with a rising edge of the second internal clock signal ICLK_O in a period that the pulse of the chip selection signal CS is inputted and may be generated to have a pulse width corresponding to a half of a cycle time of the second internal clock signal ICLK_O.

The command latch unit 42 may latch a command signal included in the command address signal CA in synchronization with the pulse of the first command latch signal CMD_LAT1 to generate a first internal command signal ICMD1. In addition, the command latch unit 42 may latch a command signal included in the command address signal CA in synchronization with the pulse of the second command latch signal CMD_LAT2 to generate a second internal command signal ICMD2.

The command synthesizer 43 may synthesize the first and second internal command signals ICMD1 and ICMD2 to generate the synthesized internal command signal ICMD_SUM. The synthesized internal command signal ICMD_SUM may be generated to include the first internal command signal ICMD1 latched in synchronization with the pulse of the first command latch signal CMD_LAT1 and the second internal command signal ICMD2 latched in synchronization with the pulse of the second command latch signal CMD_LAT2.

Figure 3:
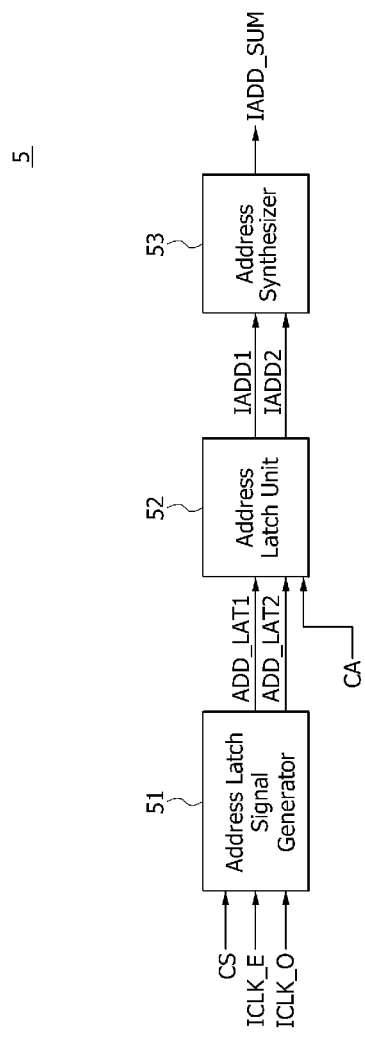
FIG. 3 is a block diagram illustrating an internal address generator included in the semiconductor system of FIG. 1.
Figure 4:
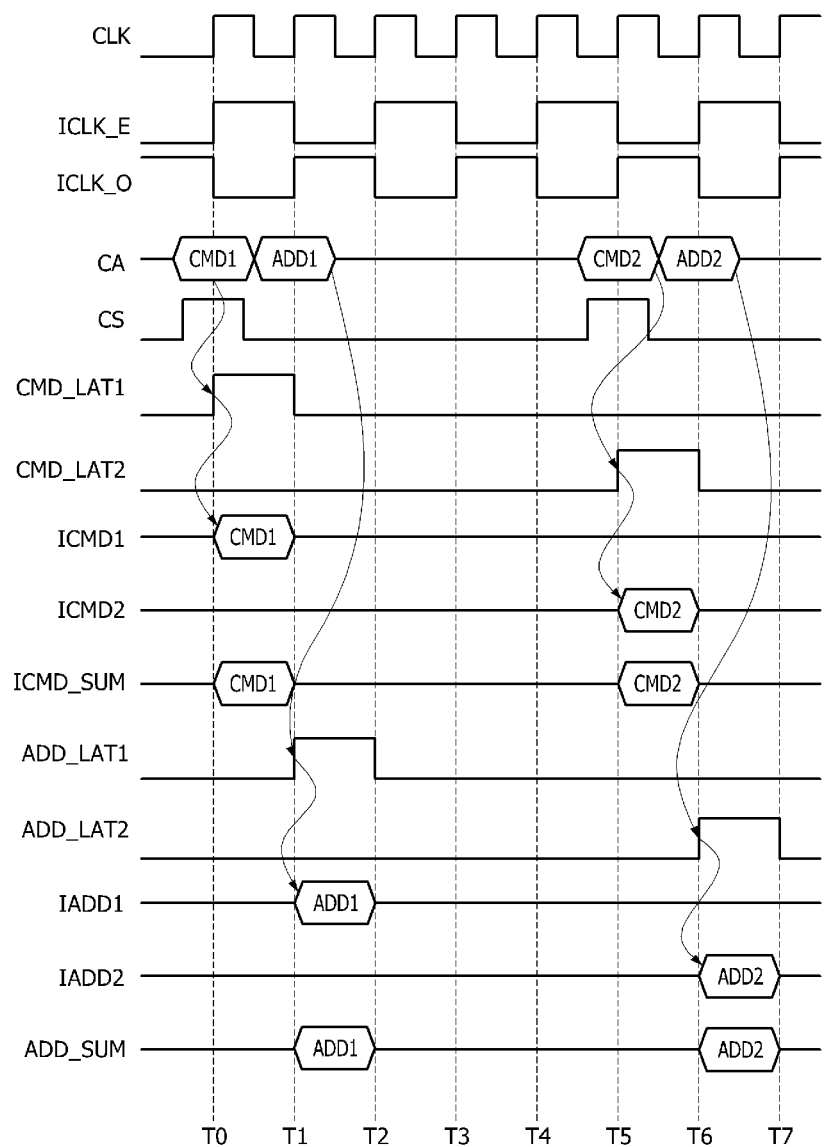
FIG. 4 is a timing diagram illustrating an operation of the semiconductor system illustrated in FIG. 1.

Referring to FIG. 3, the internal address generator 5 may include an address latch signal generator 51, an address latch unit 52 and an address synthesizer 53.

The address latch signal generator 51 may generate a pulse of a first address latch signal ADD_LAT1 and a pulse of a second address latch signal ADD_LAT2 when a pulse of the chip selection signal CS is inputted thereto. An external control signal may include the chip selection signal CS and may be used for selecting a chip included in the semiconductor device 2 and for selecting the semiconductor device itself. The pulses of the first and second address latch signals ADD_LAT1 and ADD_LAT2 may be generated at different points of time with different pulse widths according to the embodiments. In the present embodiment, the pulse of the first address latch signal ADD_LAT1 may be generated in synchronization with a first falling edge of the first internal clock signal ICLK_E or a first rising edge of the second internal clock signal ICLK_O after the pulse of the first command latch signal CMD_LAT1 is generated and may be generated to have a pulse width corresponding to a half of a cycle time of the first internal clock signal ICLK_E. Furthermore, the pulse of the second address latch signal ADD_LAT2 may be generated in synchronization with a first rising edge of the first internal clock signal ICLK_E or a first falling edge of the second internal clock signal ICLK_O after the pulse of the second command latch signal CMD_LAT2 is generated and may be generated to have a pulse width corresponding to a half of a cycle time of the second internal clock signal ICLK_O.

The address latch unit 52 may latch an address signal included in the command address signal CA in synchronization with the pulse of the first address latch signal ADD_LAT1 to generate a first internal address signal IADD1. In addition, the address latch unit 52 may latch an address signal included in the command address signal CA in synchronization with the pulse of the second address latch signal ADD_LAT2 to generate a second internal address signal IADD2.

The address synthesizer 53 may synthesize the first and second internal address signals IADD1 and IADD2 to generate the synthesized internal address signal IADD_SUM. The synthesized internal address signal IADD_SUM may be generated to include the first internal address signal IADD1 latched in synchronization with the pulse of the first address latch signal ADD_LAT1 and the second internal address signal IADD2 latched in synchronization with the pulse of the second address latch signal ADD_LAT2.

An operation of the semiconductor system as set forth above will be described hereinafter with reference to FIGS. 1, 2, 3 and 4.

The internal clock generator 3 may divide the clock signal CLK supplied from the controller 1 to generate the first and second internal clock signals ICLK_E and ICLK_O having a frequency which is half that of the clock signal CLK. The first internal clock signal ICLK_E may be generated to have rising edges which are synchronized with points of time "T0", "T2", "T4" and "T6" that odd-numbered rising edges of the clock signal CLK occur and to have falling edges which are synchronized with points of time "T1", "T3", "T5" and "T7" that even-numbered rising edges of the clock signal CLK occur. The second internal clock signal ICLK_O may be generated to have rising edges which are synchronized with the points of time "T1", "T3", "T5" and "T7" that even-numbered rising edges of the clock signal CLK occur and to have falling edges which are synchronized with the points of time "T0", "T2", "T4" and "T6" that odd-numbered rising edges of the clock signal CLK occur.

The command latch signal generator 41 may generate a pulse of the first command latch signal CMD_LAT1 from the first internal clock signal ICLK_E and a pulse of the second command latch signal CMD_LAT2 from the second internal clock signal ICLK_O when a pulse of the chip selection signal CS is inputted thereto. If the pulse of the chip selection signal CS is inputted to the command latch signal generator 41 at the point of time "T0" that the first rising edge of the clock signal CLK occurs, the pulse of the first command latch signal CMD_LAT1 may be generated from the first internal clock signal ICLK_E during a period between the points of time "T0" and "T1". Further, if the pulse of the chip selection signal CS is inputted to the command latch signal generator 41 at the point of time "T5" that the sixth rising edge of the clock signal CLK occurs, the pulse of the second command latch signal CMD_LAT2 may be generated from the second internal clock signal ICLK_O during a period between the points of time "T5" and "T6". That is, the pulse of the first command latch signal CMD_LAT1 may be generated when the pulse of the chip selection signal CS is inputted at the odd-numbered rising edges of the clock CLK and the pulse of the second command latch signal CMD_LAT2 may be generated when the pulse of the chip selection signal CS is inputted at the even-numbered rising edges of the clock CLK.

The command latch unit 42 may latch a command signal included in the command address signal CA in synchronization with the pulse of the first command latch signal CMD_LAT1 to generate the first internal command signal ICMD1 during a period between the points of time "T0" and "T1". In addition, the command latch unit 42 may latch a command signal included in the command address signal CA in synchronization with the pulse of the second command latch signal CMD_LAT2 to generate the second internal command signal ICMD2 during a period between the points of time "T5" and "T6". The command synthesizer 43 may synthesize the first and second internal command signals ICMD1 and ICMD2 to generate the synthesized internal command signal ICMD_SUM. The synthesized internal command signal ICMD_SUM may be generated to include the first internal command signal ICMD1 latched in synchronization with the pulse of the first command latch signal CMD_LAT1 during a period between the points of time "T0" and "T1" and the second internal command signal ICMD2 latched in synchronization with the pulse of the second command latch signal CMD_LAT2 during a period between the points of time "T5" and "T6".

The address latch signal generator 51 may generate a pulse of the first address latch signal ADD_LAT1 in synchronization with the first internal clock signal ICLK_E or the second internal clock signal ICLK_O after the pulse of the first command latch signal CMD_LAT1 is generated. The address latch signal generator 51 may generate a pulse of the second address latch signal ADD_LAT2 in synchronization with the first internal clock signal ICLK_E or the second internal clock signal ICLK_O after the pulse of the second command latch signal CMD_LAT2 is generated. In the present embodiment, the pulse of the first address latch signal ADD_LAT1 may be generated during a period between the points of time "T1" and "T2" after the pulse of the first command latch signal CMD_LAT1 is generated, and the pulse of the second address latch signal ADD_LAT2 may be generated during a period between the points of time "T6" and "T7" after the pulse of the second command latch signal CMD_LAT2 is generated.

The address latch unit 52 may latch an address signal included in the command address signal CA in synchronization with the pulse of the first address latch signal ADD_LAT1 to generate the first internal address signal IADD1 during a period between the points of time "T1" and "T2". The address latch unit 52 may latch an address signal included in the command address signal CA in synchronization with the pulse of the second address latch signal ADD_LAT2 to generate the second internal address signal IADD2 during a period between the points of time "T6" and "T7". The address synthesizer 53 may synthesize the first and second internal address signals IADD1 and IADD2 to generate the synthesized internal address signal IADD_SUM. The synthesized internal address signal IADD_SUM may be generated to include the first internal address signal IADD1 latched in synchronization with the pulse of the first address latch signal ADD_LAT1 during a period between the points of time "T1" and "T2" and the second internal address signal IADD2 latched in synchronization with the pulse of the second address latch signal ADD_LAT2 during a period between the points of time "T6" and "T7".

According to the embodiments described above, the command signal and the address signal may be sequentially inputted to the semiconductor device 2 according to the chip selection signal CS. The command signal and the address signal may be sequentially latched and sequentially inputted to the semiconductor device 2 in synchronization with the pulses of the first command latch signal CMD_LAT1 and the first address latch signal ADD_LAT1 or the pulses of the second command latch signal CMD_LAT2 and the second address latch signal ADD_LAT2 which are sequentially generated according to the chip selection signal CS. The pulse of the first command latch signal CMD_LAT1 and the pulse of the first address latch signal ADD_LAT1 may be sequentially generated when the command signal synchronized with the odd-numbered rising edges of the clock signal CLK and the address signal synchronized with the even-numbered rising edges of the clock signal CLK are sequentially inputted. In addition, the pulse of the second command latch signal CMD_LAT2 and the pulse of the second address latch signal ADD_LAT2 may be sequentially generated when the command signal synchronized with the even-numbered rising edges of the clock signal CLK and the address signal synchronized with the odd-numbered rising edges of the clock signal CLK are sequentially inputted.

As described above, the semiconductor device 2 included in the semiconductor system according an embodiment of the present invention may receive the command signal and the address signal included in the command address signal CA outputted from the controller 1 in synchronization with the pulses of the first command latch signal CMD_LAT1 and the first address latch signal ADD_LAT1 or in synchronization with the pulses of the second command latch signal CMD_LAT2 and the second address latch signal ADD_LAT2. That is, regardless of whether the command signal and the address signal included in the command address signal CA are inputted at odd-numbered rising edges of the clock signal CLK or at even-numbered rising edges of the clock signal CLK, the command signal and the address signal included in the command address signal CA may be sequentially inputted to the semiconductor device 2 by the pulses of the first command latch signal CMD_LAT1, the first address latch signal ADD_LAT1, the second command latch signal CMD_LAT2 and the second address latch signal ADD_LAT2 which are internally generated from the command address signal CA. Accordingly, even though a frequency of the clock signal CLK increases with the improvement of the operation speed of the semiconductor system, commands and the addresses supplied from the controller 1 may be generated only at rising edges of the clock signal CLK to be sequentially and stably applied to the semiconductor device 2.

What is claimed is:

1. A semiconductor device comprising:
   an internal command generator suitable for generating first and second command latch signals from first and second internal clock signals in response to an external control signal and suitable for latching a command signal in response to the first and second command latch signals to generate a synthesized internal command signal; and
   an internal address generator suitable for generating first and second address latch signals from the first and second internal clock signals in response to the external control signal and suitable for latching an address signal in response to the first and second address latch signals to generate a synthesized internal address signal,
   wherein the external control signal is a chip selection signal for selecting a chip including the semiconductor device.

2. The semiconductor device of claim 1, wherein the first command latch signal includes a pulse generated from the first internal clock signal in synchronization with a pulse of the external control signal.

3. The semiconductor device of claim 2, wherein the first address latch signal includes a pulse generated after the pulse of the first command latch signal is generated.

4. The semiconductor device of claim 3, wherein the second command latch signal includes a pulse generated from the second internal clock signal in synchronization with the pulse of the external control signal.

5. The semiconductor device of claim 4, wherein the second address latch signal includes a pulse generated after the pulse of the second command latch signal is generated.

6. The semiconductor device of claim 1,
   wherein the first and second internal clock signals are generated by dividing a frequency of an external clock signal; and
   wherein the second internal clock signal is a complementary signal of the first internal clock signal.

7. The semiconductor device of claim 1, wherein the internal command generator includes:
   a command latch signal generator suitable for generating the first command latch signal from the first internal clock signal in response to the external control signal and suitable for generating the second command latch signal from the second internal clock signal in response to the external control signal;
   a command latch unit suitable for latching the command signal in response to the first and second command latch signals to generate a first internal command signal and a second internal command signal; and
   a command synthesizer suitable for synthesizing the first and second internal command signals to generate the synthesized internal command signal.

8. The semiconductor device of claim 1, wherein the internal address generator includes:
   an address latch signal generator suitable for generating the first address latch signal from the first internal clock signal in response to the external control signal and suitable for generating the second address latch signal from the second internal clock signal in response to the external control signal;
   an address latch unit suitable for latching the address signal in response to the first and second address latch signals to generate a first internal address signal and a second internal address signal; and
   an address synthesizer suitable for synthesizing the first and second internal address signals to generate the synthesized internal address signal.

9. A semiconductor system comprising:
   a controller suitable for generating a clock signal, an external control signal, a command signal and an address signal; and
   a semiconductor device including an internal command generator,
   wherein the internal command generator is suitable for generating first and second command latch signals from first and second internal clock signals generated from the clock signal in response to the external control signal and suitable for latching the command signal in response to the first and second command latch signals to generate a synthesized internal command signal, and
   wherein the external control signal is a chip selection signal for selecting a chip including the semiconductor device.

10. The semiconductor system of claim 9,
    wherein the first and second internal clock signals are generated by dividing a frequency of the clock signal; and
    wherein the second internal clock signal is a complementary signal of the first internal clock signal.

11. The semiconductor system of claim 9, wherein the first command latch signal includes a pulse generated from the first internal clock signal in synchronization with a pulse of the external control signal.

12. The semiconductor system of claim 9, wherein the second command latch signal includes a pulse generated from the second internal clock signal in synchronization with the pulse of the external control signal.

13. The semiconductor system of claim 9, wherein the internal command generator includes:
    a command latch signal generator suitable for generating the first command latch signal from the first internal clock signal in response to the external control signal and suitable for generating the second command latch signal from the second internal clock signal in response to the external control signal;
    a command latch unit suitable for latching the command signal in response to the first and second command latch signals to generate a first internal command signal and a second internal command signal; and
    a command synthesizer suitable for synthesizing the first and second internal command signals to generate the synthesized internal command signal.

14. The semiconductor system of claim 9, wherein the semiconductor device further includes an internal address generator suitable for generating first and second address latch signals from the first and second internal clock signals in response to the external control signal and suitable for latching the address signal in response to the first and second address latch signals to generate a synthesized internal address signal.

15. The semiconductor system of claim 14, wherein the first address latch signal includes a pulse generated after a pulse of the first command latch signal is generated.

16. The semiconductor system of claim 15, wherein the second address latch signal includes a pulse generated after a pulse of the second command latch signal is generated.

17. The semiconductor system of claim 14, wherein the internal address generator includes:

an address latch signal generator suitable for generating the first address latch signal from the first internal clock signal in response to the external control signal and suitable for generating the second address latch signal from the second internal clock signal in response to the external control signal;

an address latch unit suitable for latching the address signal in response to the first and second address latch signals to generate a first internal address signal and a second internal address signal; and an address synthesizer suitable for synthesizing the first and second internal address signals to generate the synthesized internal address signal.

18. A semiconductor system comprising:

a controller suitable for generating a clock signal, an external control signal, a command signal and an address signal; and a semiconductor device including an internal address generator, wherein the internal address generator is suitable for generating first and second address latch signals from first and second internal clock signals generated from the clock signal in response to the external control signal and suitable for latching the address signal in response to the first and second address latch signals to generate a synthesized internal address signal, and wherein the external control signal is a chip selection signal for selecting a chip including the semiconductor device.

* * * * *